(12) United States Patent
Alladi et al.

(10) Patent No.: US 9,300,316 B2
(45) Date of Patent: Mar. 29, 2016

(54) VOLTAGE DOUBLING CIRCUIT FOR AN ANALOG TO DIGITAL CONVERTER (ADC)

(71) Applicant: QUALCOMM Incorporated, San Diego, CA (US)

(72) Inventors: Dinesh Jagannath Alladi, San Diego, CA (US); Sean Baker, San Diego, CA (US); Balasubramanian Sivakumar, San Diego, CA (US); Wei Huang, San Diego, CA (US); Dan Yuan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/616,464

(22) Filed: Feb. 6, 2015

(65) Prior Publication Data

US 2015/0249463 A1 Sep. 3, 2015

Related U.S. Application Data

(60) Provisional application No. 61/946,299, filed on Feb. 28, 2014.

(51) Int. Cl.
| | | |
|---|---|---|
| *H03M 1/12* | (2006.01) | |
| *H03M 1/38* | (2006.01) | |
| *H03M 1/66* | (2006.01) | |
| *H03M 1/06* | (2006.01) | |
| *H03M 1/40* | (2006.01) | |
| *H03M 1/46* | (2006.01) | |

(52) U.S. Cl.
CPC .......... *H03M 1/1245* (2013.01); *H03M 1/0682* (2013.01); *H03M 1/38* (2013.01); *H03M 1/66* (2013.01); *H03M 1/403* (2013.01); *H03M 1/468* (2013.01)

(58) Field of Classification Search
CPC ..... H03M 1/468; H03M 1/0682; H03M 1/46; H03M 1/466; H03M 1/12; H03M 1/1245; H03M 1/442
USPC ................... 341/144, 150, 155, 172
See application file for complete search history.

(56) References Cited

U.S. PATENT DOCUMENTS

| | | | | |
|---|---|---|---|---|
| 6,433,724 B1 * | 8/2002 | Confalonieri | ......... | H03M 1/068 341/155 |
| 7,432,844 B2 * | 10/2008 | Mueck | ................ | H03M 1/0682 341/161 |
| 7,456,768 B2 * | 11/2008 | La Rue | ............... | H03M 1/1245 341/140 |

(Continued)

OTHER PUBLICATIONS

International Search Report and Written Opinion—PCT/US2015/015056—ISA/EPO—May 8, 2015.

*Primary Examiner* — Linh Nguyen
(74) *Attorney, Agent, or Firm* — Fountainhead Law Group P.C.

(57) ABSTRACT

In one embodiment, a circuit includes a first input of a comparator for an analog to digital converter (ADC). The first input is coupled to a first capacitive network. The circuit further includes a second input of the comparator for the ADC. The second input is coupled to a second capacitive network. The first capacitive network includes a first set of capacitors where a first plate of the first set of capacitors is selectively coupled to an input signal. The second capacitive network includes a second set of capacitors where a second plate of the first set of capacitors is selectively coupled to the input signal. The first plate and the second plate are opposite plates of the first set of capacitors and the second set of capacitors.

22 Claims, 5 Drawing Sheets

(56) References Cited

U.S. PATENT DOCUMENTS

| | | | |
|---|---|---|---|
| 7,501,974 B2 * | 3/2009 | Confalonieri | H03M 1/0682 341/155 |
| 8,004,447 B2 * | 8/2011 | Hsu | H03M 1/16 341/155 |
| 8,274,179 B2 | 9/2012 | Fagg et al. | |
| 8,416,115 B2 | 4/2013 | Araki et al. | |
| 8,547,160 B2 | 10/2013 | Dedic et al. | |
| 8,599,059 B1 * | 12/2013 | Chung | H03M 1/466 341/163 |
| 8,660,506 B2 | 2/2014 | Furuta et al. | |
| 8,717,221 B2 * | 5/2014 | Jeon | H03M 1/0678 341/163 |
| 8,860,600 B1 * | 10/2014 | Yang | H03M 1/466 341/150 |
| 2003/0206038 A1 * | 11/2003 | Mueck | H03K 5/249 327/50 |
| 2006/0244647 A1 * | 11/2006 | Takano | H03M 1/804 341/144 |
| 2007/0001892 A1 | 1/2007 | Kuttner | |
| 2010/0283643 A1 * | 11/2010 | Byrne | H03M 1/1225 341/122 |
| 2011/0032134 A1 * | 2/2011 | Cho | H03M 1/0682 341/144 |
| 2012/0280841 A1 * | 11/2012 | Wang et al. | 341/110 |
| 2012/0280846 A1 | 11/2012 | Lin | |
| 2012/0319880 A1 | 12/2012 | Matsumoto et al. | |
| 2014/0077982 A1 | 3/2014 | Wu et al. | |

\* cited by examiner

US 9,300,316 B2

VOLTAGE DOUBLING CIRCUIT FOR AN ANALOG TO DIGITAL CONVERTER (ADC)

CROSS REFERENCE TO RELATED APPLICATIONS

The present disclosure claims priority to U.S. Provisional App. No. 61/946,299, entitled "VOLTAGE DOUBLING CIRCUIT FOR AN ANALOG TO DIGITAL CONVERTER (ADC)", filed Feb. 28, 2014, the contents of which is incorporated herein by reference in its entirety.

BACKGROUND

Particular embodiments generally relate to sampling circuits, and more particularly to analog-to-digital converters (ADC).

Unless otherwise indicated herein, the approaches described in this section are not admitted to be prior art by inclusion in this section.

A successive approximation register (SAR) analog-to-digital converter (ADC) may convert an analog signal to a digital signal using a binary search algorithm in a feedback loop. The SAR ADC samples an input signal every clock cycle during a sampling phase on the top or bottom plates of the digital-to-analog converter (DAC) capacitors. The top plate is defined as the capacitor terminal that connects to the comparator inputs during the conversion phase described later. For example, in a top plate sampling scheme, the input signal is sampled on the top plate of the DAC capacitor array during the sampling phase. A digital controller resets a comparator and bottom plates of the DAC capacitors. In this example, the top half of the DAC are reset to a reference +ref and the bottom half of the DAC is reset to a reference –ref. The sampling phase then samples the input signal on the top plates of the DAC capacitors.

A conversion phase follows every sampling phase. In the conversion phase, the sampled input signal is input into the comparator. In the SAR ADC, the conversion is performed from a most significant bit (MSB) to the least significant bit (LSB). The digital controller enables and initiates a comparator decision for each conversion phase. The comparator output then drives the controller. Once the comparator has performed the comparison, the MSB output decision is registered as a "0" or "1" based on the comparator decision. The controller then advances to the next bit, and initiates the next comparator decision using the input signal. The above process continues until all bits have been resolved.

When a single-ended input is used, a comparator common mode varies as the decision process proceeds to resolve the bits of the digital signal. The common mode of the comparator is the average voltage at the comparator input. The common mode of the comparator varies because a second input of the comparator is typically coupled to ground when using the single-ended input. In this case, the common mode of the comparator varies because the second input (e.g., the comparator negative input) is constant while the input signal varies on the first input (e.g., the comparator positive input). From the most significant bit to the least significant bit, the common mode of the comparator varies. The varying common mode may make it hard to design a high-speed comparator.

To avoid the varying of the common mode of the comparator, a differential SAR ADC design may use a differential input, differential DACs, and a differential comparator. The input signal includes two inputs vin+ and vin−, with half the input signal on each side of the differential comparator. Each half input signal may be sampled as the input to the differential DACs. The comparator decisions and output codes are the same as with the single-ended input. However, the differential input seen by the comparator is constant throughout the conversion, and thus the comparator common mode remains constant.

SUMMARY

In one embodiment, a circuit includes a first input of a comparator for an analog to digital converter (ADC). The first input is coupled to a first capacitive network. The circuit further includes a second input of the comparator for the ADC. The second input is coupled to a second capacitive network. The first capacitive network includes a first set of capacitors where a first plate of the first set of capacitors is selectively coupled to an input signal. The second capacitive network includes a second set of capacitors where a second plate of the first set of capacitors is selectively coupled to the input signal. The first plate and the second plate are opposite plates of the first set of capacitors and the second set of capacitors.

In one embodiment, a method includes: coupling a first input of a comparator for an analog to digital converter (ADC to a first capacitive network; coupling a second input of the comparator for the ADC to a second capacitive network; selectively coupling an input signal to a first plate for a first set of capacitors in the first capacitive network; and selectively coupling the input signal to a second plate for a second set of capacitors in the second capacitive network, wherein the first plate and the second plate are opposite plates of the first set of capacitors and the second set of capacitors.

In one embodiment, an analog to digital converter (ADC) includes: a digital to analog converter (DAC) comprising a first capacitive network including a first set of capacitors and a second capacitive network including a second set of capacitors; and a comparator comprising: a first input of a comparator, the first input being coupled to the first capacitive network; and a second input of the comparator, the second input being coupled to the second capacitive network, wherein: a first plate of the first set of capacitors is selectively coupled to an input signal, and a second plate of the first set of capacitors is selectively coupled to the input signal, and the first plate and the second plate are opposite plates of the first set of capacitors and the second set of capacitors.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, make apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Particular embodiments generally relate to a sampling circuit for a device, such as an analog-to-digital converter. In one embodiment, a successive approximation register (SAR) ADC is used, but the sampling circuit may be used with other devices. In one embodiment, the SAR ADC receives a single-ended input Vip. This halves the signal swing in comparison to when a differential input is used with two input pins each having similar swing. However, particular embodiments provide a voltage doubling sampler circuit that doubles the signal swing at a comparator for the single-ended input SAR ADC. By increasing the signal swing, the size of the comparator may be reduced and uses less power. Also, although single-ended inputs are described, a differential input may be used and is described below.

Figure 1:
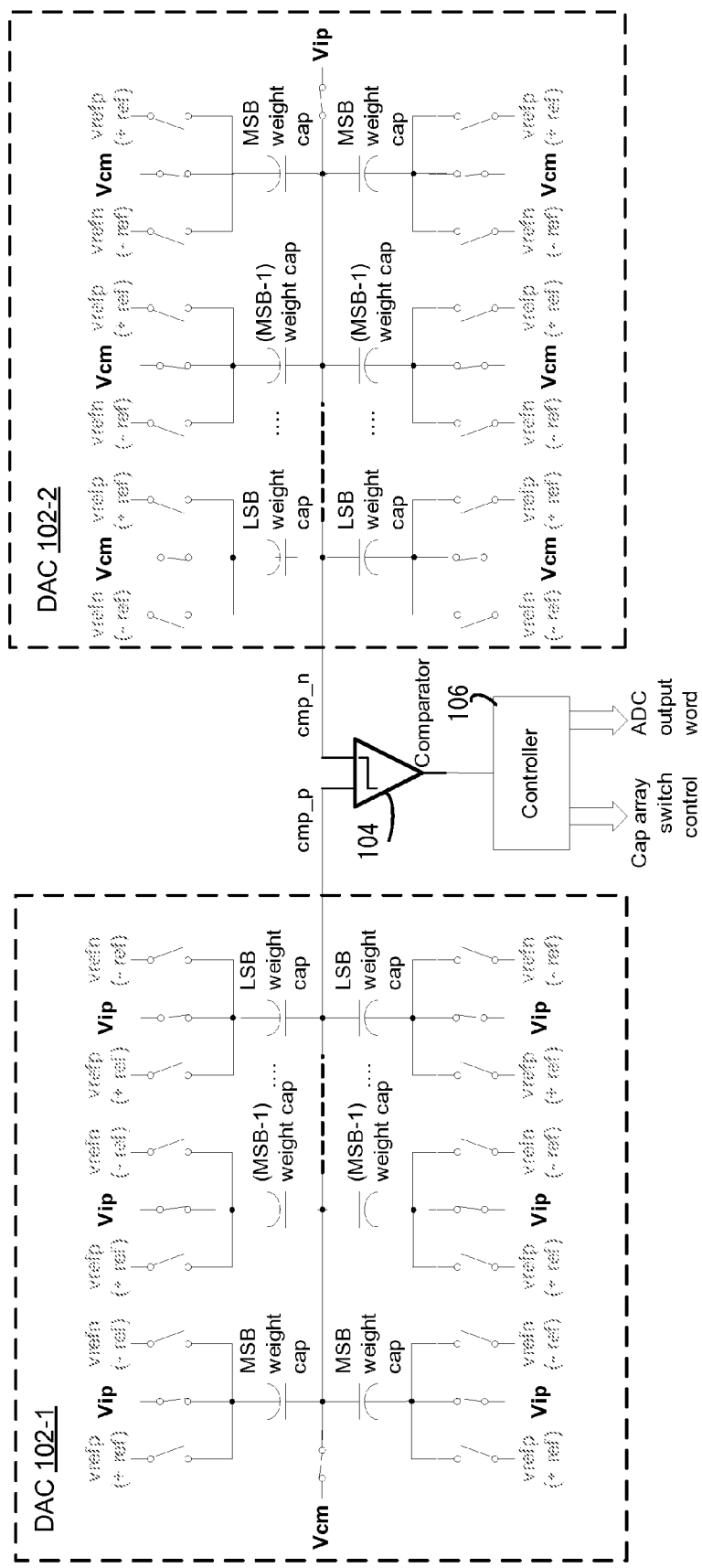
FIG. 1 shows an example of an ADC sampling circuit during a phase 1 according to one embodiment.

FIG. 1 shows an example of an ADC sampling circuit during a phase 1 according to one embodiment. In one embodiment the ADC is a SAR ADC that implements a successive-approximation algorithm to convert an analog value to a digital value. Phase 1 may be a sampling phase in which input values are sampled on capacitors in a capacitive digital-to-analog converter (DAC) 102. DAC 102 may include a DAC array 102-1 that is connected to input cmp_p (shown on the left side) and a DAC array 102-2 that is connected to input cmp_n (shown on the right side). During phase 2, the sampled input appears at the input of a comparator 104. The input cmp_p and the input cmp_n are compared by the comparator. The comparator 104 outputs a logic high level (e.g., 1) if input cmp_p is greater than input cmp_n. Conversely, if input cmp_p is less than input cmp_n, the comparator outputs a logic low level (e.g., 0). A controller 106 uses the comparator decision to control reference voltages +vrefp and −vrefn that are selectively coupled to the DAC array, and the SAR ADC makes further comparisons from a most significant bit to a least significant bit. When the conversion is complete, the ADC outputs an N-bit digital word.

High speed SAR ADCs require fast low-noise comparators. In the design of comparator 104, a noise-speed and noise-power tradeoff occurs. Having a larger signal input to a comparator allows more thermal noise in the comparator. For example, doubling the input signal swing allows two times more thermal noise in the comparator (75% less power and area) to achieve a given signal to thermal noise ratio. Also, a fixed common mode voltage may help optimize comparator speed and noise. Conventionally differential inputs enable this. However, when single-ended inputs are used with the traditional sampling circuits, such as those of the SAR ADC, challenges result. For example, for a given swing on a signal pin of a chip implementing the SAR ADC (the swing determined by supply voltage constraints of the preceding driving circuit), the signal swing gets halved versus using a differential input, resulting in 4× larger sized comparator to reduce noise by 6 dB. This increases power used significantly for similar performance. Also, the common mode of the sampler output sees half the alternating current (AC) signal swing, which can be quite large. This would appear at comparator and make design hard to optimize, especially for high dynamic range ADCs where swing is higher. Either the comparator needs to handle a range of common mode, which results in slower comparator, or an active preamp may be needed (increased power and noise). However, particular embodiments double the signal swing at a comparator while using the single-ended input. By increasing the signal swing, the size of the comparator may be reduced and uses less power. Further, the comparator common mode is made insensitive to input signal swing at input Vip.

In FIG. 1, a DAC 102 provides a sampling network that includes an inherent track/hold function for the single-ended input Vip. For example, a capacitive DAC array 102 is coupled to comparator 104, and includes capacitors of different weights, such as MSB weight cap, MSB-1 weight cap, ... LSB weight cap, that are used to resolve different bits of the N-bit digital output word. DAC 102 includes a first capacitive array (i.e., left-side DAC array 102-1) coupled to an input cmp_p of comparator 104 and a second capacitive array (i.e., right-side DAC array 102-2) coupled to an input cmp_n of comparator 104. Each side of capacitive array may include an upper portion and a lower portion that each contain the same weighted capacitors. Although this embodiment of DAC around 102 is described, it will be recognized that variations of the capacitor array may be appreciated, such as segmented DACs using multiple sub-DACs coupled through series bridge capacitors (e.g., 2-segment DAC) or C-2C DACs. As mentioned above, a single-ended input Vip is used, which provides half of the signal swing as compared to a differential input. Particular embodiments provide a novel method of configuration that doubles the swing of the input signal.

FIG. 1 depicts a circuit configuration for a first phase referred to as the sampling phase according to one embodiment. In the first phase, the input signal Vip and a direct current (DC) reference bias Vcm of the input signal Vip are sampled on the capacitors of DAC 102. In this case, for input cmp_p, the input signal Vip is selectively coupled to bottom plates of the capacitive DAC array 102. Also, for input cmp_p, the DC reference bias Vcm, which may be a fixed DC bias voltage, is selectively coupled to the top plates of the capacitive DAC array 102. The DC reference bias voltage may be generated on-chip while the single-ended input signal is generated off-chip. For input cmp_n, the DC reference bias Vcm is selectively coupled to the bottom plates of the capacitive DAC array 102 and the input voltage Vip is selectively coupled to the top plates of the capacitive DAC array 102.

Figure 2:
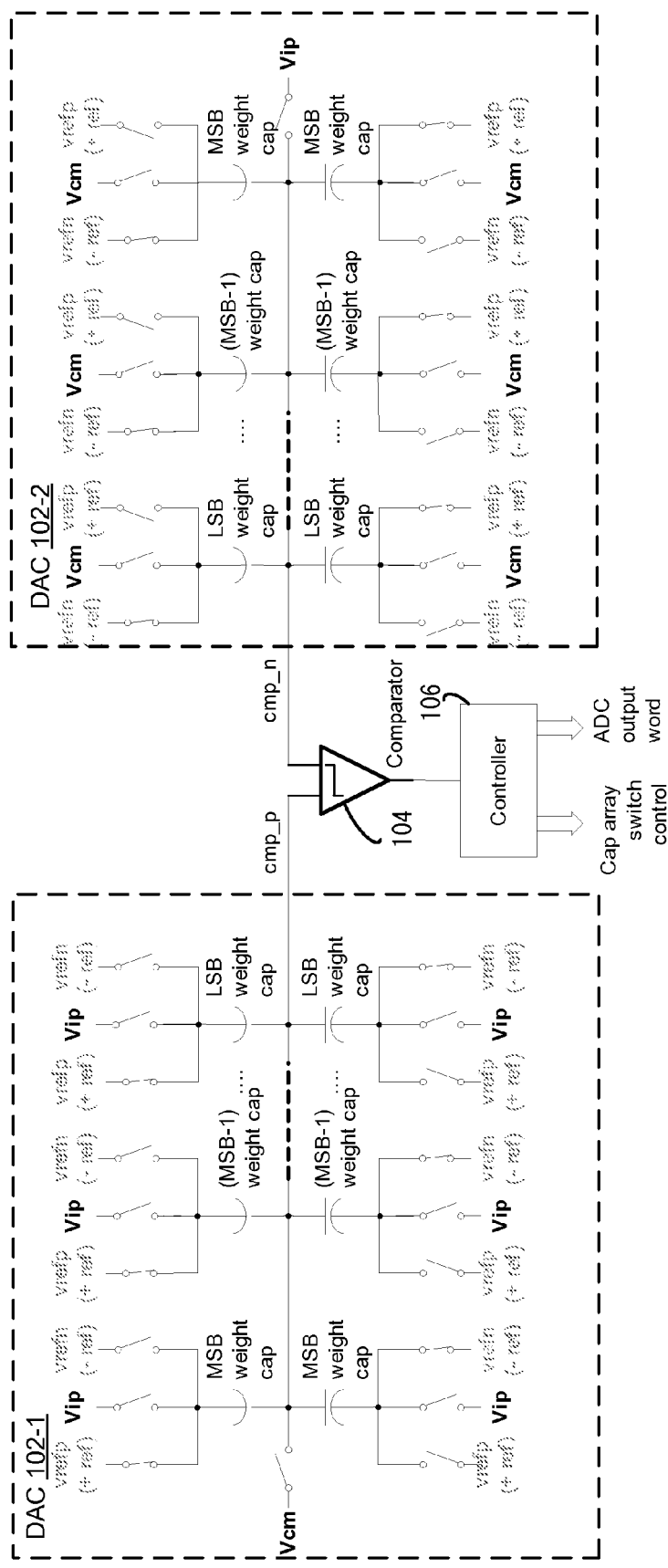
FIG. 2 depicts an example of the ADC sampling circuit during a phase 2 according to one embodiment.

During a phase 2, a comparator decision is made, such as one of the bits of the ADC output is decided. FIG. 2 depicts an example of the SAR ADC sampling circuit during a phase 2 according to one embodiment. In this phase, the connections to the top plate are removed. For example, the DC reference bias Vcm, which is connected to the top plate of the DAC array 102-1 for input cmp_p, is open, and the switch connecting input signal Vip to the top plate of the capacitive DAC array 102-2 for input cmp_n is open. Also, for the bottom plate, the switches are selectively connected to DAC references vrefp and vrefn. The connections for input signal Vip on the left-side DAC 102-1 and the connection for DC reference bias Vcm on the right-side DAC 102-2 are open at this time. The relative order in which these switches are opened can be picked to minimize any signal dependent charge injection, for example by opening the Vcm switches first before opening the switches connected to Vip.

During the conversion, the bottom plates of the capacitors in DAC 102 switch to references vrefp/vrefn, and a two times input signal appears at comparator 104. For example, for the 1$^{st}$ comparator decision (MSB), half of the capacitors switch to reference vrefp and half of the capacitors switch to reference vrefn on both left and right half DAC arrays 102, i.e., effectively bottom plates of the capacitors are at (vrefp+vrefn)/2. This is shown as:

$$V(cmp\_p)=(vrefp+vrefn)/2-(Vip-Vcm) \& V(cmp\_n)=(vrefp+vrefn)/2+(Vip-Vcm)$$

$$\text{Differential input to comparator}=V(cmp\_p)-V(cmp\_n)=-2\times(Vip-Vcm)$$

$$\text{Common mode to comparator}=[V(cmp\_p)+V(cmp\_n)]/2=(vrefp+vrefn)/2$$

The above couplings double the signal swing seen at the input of comparator 104. The full input signal (Vip-Vcm) is sampled on both sets of DAC capacitors (e.g., the left and right DAC arrays 102) with different polarities. To illustrate this with a simplified example, for the input cmp_p, the voltage stored on the capacitors is voltage Vcm–voltage Vip. If Vcm is 0.5 volts and Vip is 0 volts, then the voltage stored is 0.5–0=0.5 volts. For the input cmp_n, the voltage stored on the capacitors is the input voltage Vip minus the DC reference bias Vcm. In this case, the voltage stored is Vip-Vcm=0-0.5=-0.5. In phase 2, the difference of these voltages is presented to the input of comparator 104; thus, the swing of the input signal to comparator 104 has been doubled from 0-0.5 to -0.5 to 0.5.

A comparator common mode may be the average of the comparator's inputs. In particular embodiments, the comparator common mode voltage is also fixed and insensitive to the swing of input signal Vip. For example, the comparator common mode is (vrefp+vrefn)/2. The voltages vrefp and vrefn are the reference voltages applied to DAC capacitors depending on the output of comparator 104 for each decision. As can be seen, the comparator common mode does not vary based on the input signal Vip, and only relies on the value of the reference voltages, which are constant. By making the comparator common mode voltage fixed and not dependent on the input signal Vip, particular embodiments optimize comparator speed and noise for a single-ended input. Also, having a fixed comparator common mode makes designing the comparator simpler because the comparator does not need to handle a range of common mode voltages, which increases the speed of the comparator 104 and saves power. Thus, comparator design requirements are relaxed.

Comparator 104 compares the inputs cmp_p and cmp_n to make a comparator decision as described above. Comparator 104 outputs the decision to controller 106, which then can selectively control the switches of DAC 102 to perform the next decision. Also, controller 106 outputs the digital word when the N-bit decision has been performed.

In one example of an SAR ADC referring to FIGS. 1 and 2, the positive reference voltage vrefp is equal to +1 volt (V), the negative reference voltage vrefn is equal to -1V. The DC reference bias Vcm is equal to 0V and the input voltage Vip is equal to -0.42V. This is a single-end input signal.

In the sampling phase, for input cmp_p of comparator 104, the DC reference bias Vcm is sampled on the top plates of the capacitors for the DAC 102 and the input signal Vip is sampled on the bottom plates of the capacitors. This means the top plates of the capacitors of left side DAC array 102-1 at each 0V and the bottom plates are at -0.42V. For input cmp_n of comparator 104, the DC reference bias Vcm is sampled on the bottom plates of the capacitors for the right side DAC array 102-2 and the input signal Vip is sampled on the top plates of the capacitors. This means the top plates of the capacitors of right side DAC array 102-2 at each -0.42V and the bottom plates are at 0V.

At the start of the conversion phase, referring to FIG. 2, controller 106 switches the capacitors of DAC array 102 such that before the MSB decision, switches are configured as shown in FIG. 2. In this case, input cmp_p goes to +0.42V (e.g., Vcm-Vip=0V--0.42V=+0.42V) due to the top plates of capacitors of DAC array 102 being coupled previously to the DC reference bias Vcm. Input cmp_n goes to -0.42V (e.g., Vip-Vcm=-0.42V-0V=-0.42V) due to the top plates of capacitors of DAC array 102 being coupled previously to input Vip. Thus, comparator 104 sees a voltage swing of 0.84V, which equals 2× of the input signal Vip. The differential reference voltage is still 2V as a difference between the positive reference vrefp and the negative reference vrefn is +1V--1V=2V.

The following will describe the decision-making process if a 5 bit SAR ADC is used. The capacitor sizes may be referred to as 16C, 8C, 4C, 2C, and C, and correspond to the MSB to the LSB. For bit #5, the MSB decision, which adjusts the reference voltages coupled to the 16C size capacitor, the input cmp_p minus the input cmp_n is cmp_p-cmp_n=0.84V>0. In this case, the comparison at the input of comparator 104 is greater than 0 and comparator 104 outputs a logic high (e.g., "1"). Controller 106 outputs an MSB output code of "1". For each comparator decision, the controller changes either the top or bottom switches on DAC 102-1 and 102-2 for the appropriate capacitor weight as follows. The top portion of the 16C DAC capacitor connected to input cmp_p (on the left side DAC 102-1 of FIG. 2) is switched to the negative reference vrefn, and the top portion of the 16C DAC capacitor connected to input cmp_n (on the right side DAC 102-2 of FIG. 2) is switched to positive reference vrefp. The remaining switches are left unchanged. This decreases input cmp_p and increases input cmp_n by ref/4, which is 0.5V each.

For the bit #4 (which adjusts the 8C capacitors of DAC array 102), input cmp_p minus cmp_n is equal to: cmp_p-cmp_n=-0.16V<0. Because the comparison at comparator 104 is negative, comparator 104 outputs a logic low (e.g., 0) for the comparator decision and the bit #4 output is equal to "0". After the decision is output, controller 106 may change the reference for the lower portion of the 8C DAC capacitor in left side DAC array 102-1 from reference vrefn to the positive reference vrefp which increases input cmp_p and the lower portion 8C DAC capacitor in right side DAC array 102-2 from reference vrefp to reference vrefn. The remaining switches are left unchanged. This increases the voltage level at cmp_n and decreases the voltage level at input cmp_n by ref/8=0.25V each.

For bit #3 (which adjusts the 4C capacitors of DAC array 102), input cmp_p minus input cmp_n is equal to: cmp_p-cmp_n=+0.34V>0. Comparator 104 outputs a logic high for the comparator decision. The bit #3 output is less than "1". Controller 106 switches the 4C capacitor on the top part of left DAC array 102-1 to the negative reference vrefn, and 4C capacitor on the top part of right DAC array 102-2 to the positive reference vrefp. The remaining switches are left unchanged. This decreases input cmp_p and increases input cmp_n by ref/16=0.25V each.

For bit #2 (which adjusts the 2C capacitors of DAC array 102), input cmp_p minus input cmp_n is equal to: cmp_p-cmp_n=+0.09V>0. Comparator 104 outputs a comparator decision of a logic high. Thus, the bit #2 output is equal to "1".

Controller 106 changes the 2C capacitor on the upper part of left DAC array 102-1 to the negative reference vrefn, and the 2C capacitor on the upper part of right DAC array 102-2 to the positive reference vrefp, which decreases input cmp_p and increases cmp_n by ref/32=0.125V each. Also, the remaining switches are left unchanged.

For bit #1 (which adjusts the 1C capacitor or LSB), input cmp_p minus input cmp_n is equal to: cmp_p−cmp_n=−0.035V<0. Comparator 104 outputs a comparator decision of a logic low. Thus, the bit #1 output is equal to "0". This makes the final output 10110. The final ADC output word is the same as would be determined using a differential input. However, using the single-ended input, the voltage swing seen at the comparator is 2× the input. The configuration above allows the comparator to see 2× the input. Also, the comparator common mode remained constant throughout the search process.

The following provides equations that describe particular embodiments.

Voltage seen at positive comparator input at start of conversion phase:

$$V_{cmp\_p} = V_{cm} + \frac{2Csar}{2Csar + Cp}(V_{ref,CM} - V_{ip})$$

where $V_{ref,CM}$ is (Vrefp+Vrefn)/2, $C_p$ is parasitic cap on top plate, $C_{sar}$ is total DAC cap.

Voltage seen at negative comparator input at start of conversion phase:

$$V_{cmp\_n} = V_{ip} + \frac{2Csar}{2Csar + Cp}(V_{ref,CM} - V_{cm})$$

Differential voltage seen at comparator input:

$$V_{cmp,diff} = \frac{4Csar + Cp}{2Csar + Cp} * Vcm - \frac{4Csar + Cp}{2Csar + Cp} * V_{ip} \approx -2(V_{ip} - V_{cm})$$

since usually $C_{sar} \gg C_p$ $V_{cm}$ may be selected to be close to DC average of Vip ($V_{ip,dc}$) to minimize DC and ADC dynamic range requirements. In this case $V_{cmp,diff} \approx 2V_{ip}$ Comparator common-mode is signal swing independent when $C_{sar} \gg C_p$ $$V_{cmp,cm} = \frac{Cp}{2Csar + Cp} * (V_{ip} + V_{cm}) + \frac{2Csar}{2Csar + Cp} * V_{ref,CM} \approx V_{ref,CM}$$

Also, if a different comparator common mode voltage is desired, various common mode translations/control schemes may be possible. The comparator common mode voltage can be set to a different value by adding additional common mode comparators/switches to the sampling circuit that switch in a common mode fashion at the end of the sampling. This may be convenient when different reference voltages vref scaling relative to the input signal is already needed. Also, it may be possible to translate the common mode within the comparator. Since the circuit is processing a known DC voltage, the common mode translation may be a low bandwidth or open loop, and the speed critical comparator circuits may not be compromised.

Figure 3:
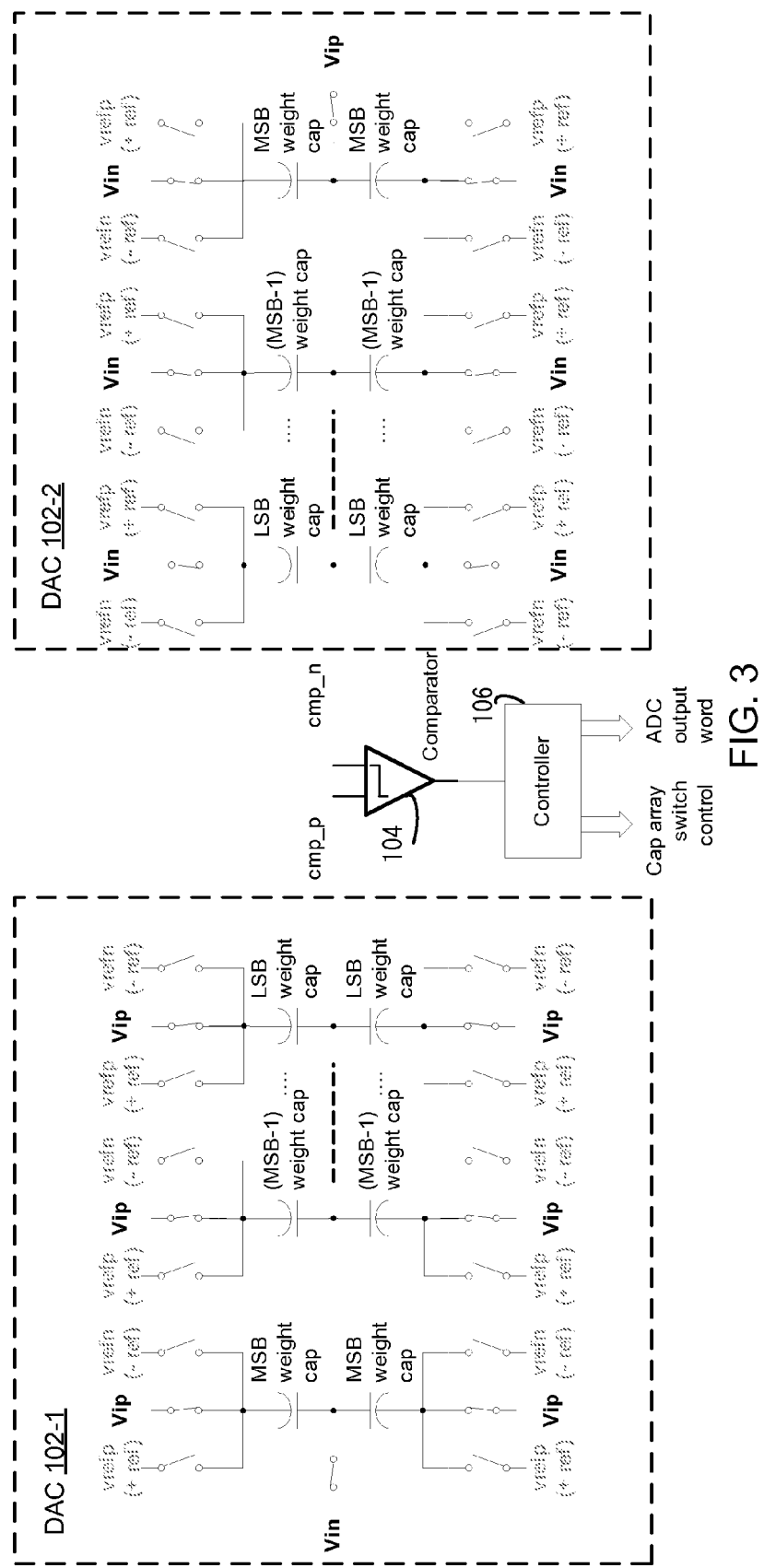
FIGS. 3 and 4 depict an example using a differential input according to one embodiment.
Figure 4:
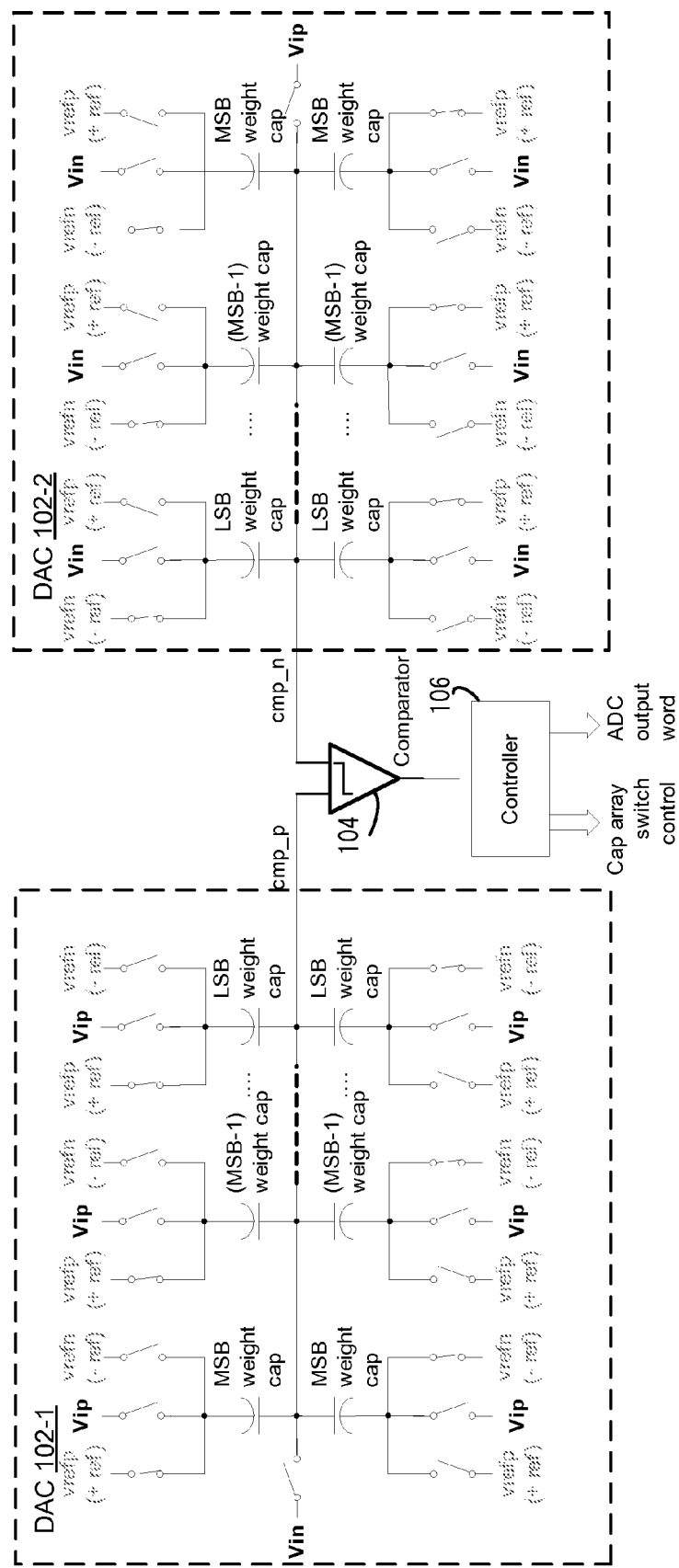

Although a single-ended input is described, the scheme can also be used with differential inputs and serve as a voltage doubler to relax comparator noise requirements. FIGS. 3 and 4 depict an example using a differential input according to one embodiment. In FIG. 3, a full differential signal (Vip−Vin) is sampled on both sets of DAC capacitors (both left and right DAC array 102s). As shown, the positive input Vip is coupled to the bottom plate of the DAC capacitors on the left side of DAC array 102 and the negative input Vin is coupled to the top plate of the DAC capacitors on the left side of DAC array 102. The negative input Vin is coupled to the top plate of the DAC capacitors on the right side of DAC array 102 and the positive input Vip is coupled to the top plate of the DAC capacitors on the right side of DAC array 102.

In FIG. 4, during conversion, the bottom plates switch to vrefp/vrefn, and 2× input signal appears at the comparator. For example, for the 1$^{st}$ comparator decision (MSB), half of the capacitors switch to reference vrefp and half of the capacitors switch to reference vrefn on both left and right DAC array 102s, i.e., effectively bottom plates of the capacitors are at (vrefp+vrefn)/2. This is shown as:

$V(cmp\_p)=(vrefp+vrefn)/2-(Vip-Vin)$ & $V(cmp\_n)=(vrefp+vrefn)/2+(Vip-Vin)$ i.e., differential input to comparator=$V(cmp\_p)-V(cmp\_n)=-2\times(Vip-Vin)$.

Figure 5:
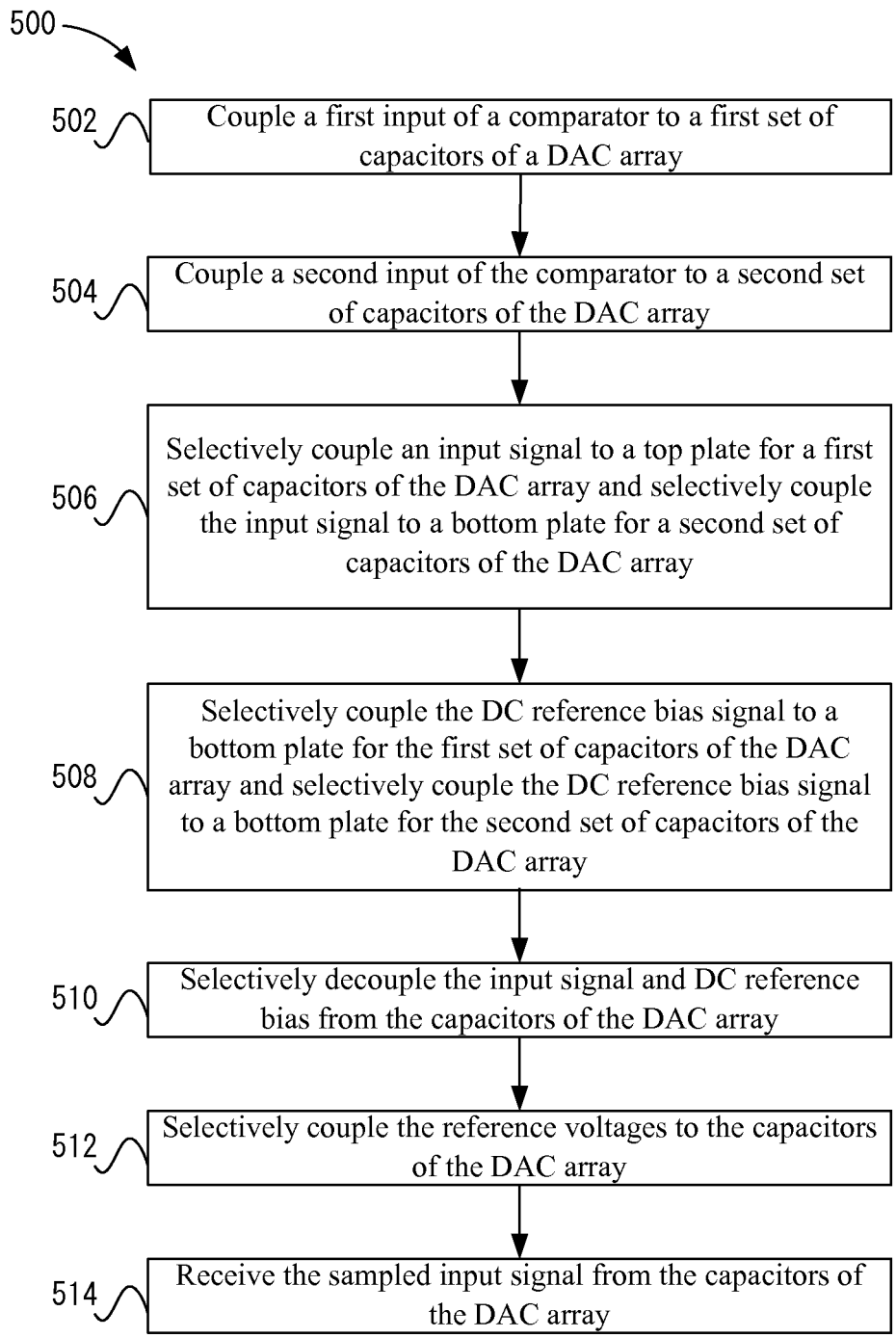
FIG. 5 depicts a simplified flowchart of a method for converting an input signal to a digital signal according to one embodiment.

FIG. 5 depicts a simplified flowchart 500 of a method for converting an input signal to a digital signal according to one embodiment. In this example, the DC reference bias signal is used, but the input signal Vin in the differential input embodiment could be used in this method in place of the DC reference bias signal. At 502, the method couples a first input of comparator 104 to a first set of capacitors of DAC array 102. At 504, the method couples a second input of comparator 104 to a second set of capacitors of DAC array 102.

In a sampling phase, at 506, the method selectively couples an input signal to a top plate for a first set of capacitors of DAC array 102 and selectively couples the input signal to a bottom plate for a second set of capacitors of DAC array 102. The top plate and the bottom plate are opposite plates of the capacitors. At 508, the method selectively couples the DC reference bias signal to a bottom plate for the first set of capacitors of DAC array 102 and selectively couples the DC reference bias signal to a bottom plate for the second set of capacitors of DAC array 102.

In a conversion phase, at 510, the method selectively decouples the input signal and DC reference bias from the capacitors of the DAC array 102. Also, at 512 the method selectively couples the reference voltages to the capacitors of the DAC array 102. At 514, comparator 104 receives the sampled input signal from the capacitors of the DAC array.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:
1. A circuit comprising:
a first input of a comparator for an analog to digital converter (ADC), the first input being coupled to a first capacitive network; and a second input of the comparator for the ADC, the second input being coupled to a second capacitive network, wherein:

the first capacitive network includes a first set of capacitors, wherein a first plate of the first set of capacitors is selectively coupled to a single-ended input signal and a second plate of the first set of capacitors is selectively coupled to a direct current (DC) reference bias of the single-ended input signal, the second capacitive network includes a second set of capacitors, wherein a second plate of the second set of capacitors is selectively coupled to the single-ended input signal and a first plate of the second set of capacitors is selectively coupled to the DC reference bias of the single-ended input signal, and the first plate of the first set of capacitors and the first plate of the second set of capacitors are opposite plates from the second plate of the first set of capacitors and the second plate of the second set of capacitors.

2. The circuit of claim 1, wherein a voltage swing of the input signal is doubled at the first input and the second input of the comparator using the first capacitive network and the second capacitive network.

3. The circuit of claim 1, wherein:

a first reference voltage and a second reference voltage are selectively coupled to the first plate of the first set of capacitors, and the first reference voltage and the second reference voltage are selectively coupled to the first plate of the second set of capacitors.

4. The circuit of claim 3, wherein:

the first plate of the first set of capacitors and the second set of capacitors is a bottom plate, and the second plate of the first set of capacitors and the second set of capacitors is a top plate.

5. The circuit of claim 1, wherein a common mode of the comparator is constant during a decision making process of converting the input signal to a digital value.

6. The circuit of claim 5, wherein the common mode of the comparator is based on a first reference voltage and a second reference voltage selectively coupled to the first set of capacitors and the second set of capacitors.

7. The circuit of claim 1, further comprising:

a controller coupled to the comparator, wherein the controller is configured to selectively couple a first reference voltage and a second reference voltage to the first set of capacitors and the second set of capacitors.

8. The circuit of claim 7, wherein:

the controller selectively couples the first reference voltage and the second reference voltage to the first plate of the first set of capacitors, and the controller selectively couples the first reference voltage and the second reference voltage to a first plate of the second set of capacitors.

9. A method comprising:

coupling a first input of a comparator for an analog to digital converter (ADC to a first capacitive network;

coupling a second input of the comparator for the ADC to a second capacitive network;

selectively coupling an input signal to a first plate for a first set of capacitors in the first capacitive network and selectively coupling a second plate of the first set of capacitors to a direct current (DC) reference bias of the single-ended input signal; and selectively coupling the input signal to a second plate for a second set of capacitors in the second capacitive network and selectively coupling a first plate of the second set of capacitors to the DC reference bias of the single-ended input signal, the first plate of the first set of capacitors and the first plate of the second set of capacitors are opposite plates from the second plate of the first set of capacitors and the second plate of the second set of capacitors.

10. The method of claim 9, wherein a voltage swing of the input signal is doubled at the first input and the second input of the comparator using the first capacitive network and the second capacitive network.

11. The method of claim 9, further comprising:

selectively coupling a first reference voltage and a second reference voltage to the first plate of the first set of capacitors, and selectively coupling the first reference voltage and the second reference voltage to the first plate of the second set of capacitors.

12. The method of claim 11 wherein:

the first plate of the first set of capacitors and the second set of capacitors is a bottom plate, and the second plate of the first set of capacitors and the second set of capacitors is a top plate.

13. The method of claim 9, wherein a common mode of the comparator is constant during a decision making process of converting the input signal to a digital value.

14. An analog to digital converter (ADC) comprising:

a digital to analog converter (DAC) comprising a first capacitive network including a first set of capacitors and a second capacitive network including a second set of capacitors; and a comparator comprising:

a first input of a comparator, the first input being coupled to the first capacitive network; and a second input of the comparator, the second input being coupled to the second capacitive network, wherein:

a first plate of the first set of capacitors is selectively coupled to a single-ended input signal and a second plate of the first set of capacitors is selectively coupled to a direct current (DC) reference bias of the single-ended input signal, a second plate of the second set of capacitors is selectively coupled to the single-ended input signal and a first plate of the second set of capacitors is selectively coupled to the DC reference bias of the single-ended input signal, and the first plate of the first set of capacitors and the first plate of the second set of capacitors are opposite plates from the seond plate of the first set of capacitors and the second plate of the second set of capacitors.

15. The method of claim 13, wherein the common mode of the comparator is based on a first reference voltage and a second reference voltage selectively coupled to the first set of capacitors and the second set of capacitors.

16. The method of claim 9, further comprising:

coupling a controller to the comparator, wherein the controller is configured to selectively couple a first reference voltage and a second reference voltage to the first set of capacitors and the second set of capacitors.

17. The method of claim 16, wherein:

the controller selectively couples the first reference voltage and the second reference voltage to the first plate of the first set of capacitors, and the controller selectively couples the first reference voltage and the second reference voltage to a first plate of the second set of capacitors.

18. The ADC of claim 14, wherein a voltage swing of the input signal is doubled at the first input and the second input of the comparator using the first capacitive network and the second capacitive network.

19. The ADC of claim 14, wherein:
- a first reference voltage and a second reference voltage are selectively coupled to the first plate of the first set of capacitors, and
- the first reference voltage and the second reference voltage are selectively coupled to the first plate of the second set of capacitors.

20. The ADC of claim 19, wherein:
- the first plate of the first set of capacitors and the second set of capacitors is a bottom plate, and
- the second plate of the first set of capacitors and the second set of capacitors is a top plate.

21. The ADC of claim 14, wherein a common mode of the comparator is constant during a decision making process of converting the input signal to a digital value.

22. The ADC of claim 21, wherein the common mode of the comparator is based on a first reference voltage and a second reference voltage selectively coupled to the first set of capacitors and the second set of capacitors.

* * * * *